US007732350B2

(12) United States Patent
Hasper et al.

(10) Patent No.: US 7,732,350 B2
(45) Date of Patent: Jun. 8, 2010

(54) CHEMICAL VAPOR DEPOSITION OF TIN FILMS IN A BATCH REACTOR

(75) Inventors: Albert Hasper, Meppel (NL); Gert-Jan Snijders, Amersfoort (NL); Lieve Vandezande, Oud-Heverlee (BE); Marinus J. De Blank, Heverlee (BE); Radko Gerard Bankras, Enschede (NL)

(73) Assignee: ASM International N.V. (NL)

( * ) Notice: Subject to any disclaimer, the term of this patent is extended or adjusted under 35 U.S.C. 154(b) by 468 days.

(21) Appl. No.: 11/634,043

(22) Filed: Dec. 4, 2006

(65) Prior Publication Data
US 2007/0077775 A1 Apr. 5, 2007

Related U.S. Application Data

(63) Continuation of application No. 11/096,861, filed on Mar. 31, 2005.

(60) Provisional application No. 60/612,332, filed on Sep. 22, 2004.

(51) Int. Cl.
*H01L 21/469* (2006.01)
(52) U.S. Cl. .............................. 438/785; 257/E21.16
(58) Field of Classification Search ................. 438/785; 257/E21.16
See application file for complete search history.

(56) References Cited

U.S. PATENT DOCUMENTS

| | | | |
|---|---|---|---|
| 2,865,791 A | 12/1958 | Ruppet et al. |
| 4,188,444 A | 2/1980 | Landau |
| 4,262,631 A | 4/1981 | Kubacki |
| 4,277,320 A | 7/1981 | Beguwala et al. |
| 4,279,947 A | 7/1981 | Goldman et al. |
| 4,298,629 A | 11/1981 | Nozaki et al. |
| 4,363,828 A | 12/1982 | Brodsky et al. |
| 4,389,973 A | 6/1983 | Suntola et al. |
| 4,402,997 A | 9/1983 | Hogan et al. |
| 4,413,022 A | 11/1983 | Suntola et al. |
| 4,428,975 A | 1/1984 | Dahm et al. |
| 4,495,218 A | 1/1985 | Azuma et al. |

(Continued)

FOREIGN PATENT DOCUMENTS

DE 101 32 882 A1 12/2002

(Continued)

OTHER PUBLICATIONS

Hiltunen et al., "Nitrides of Titanium, Niobium, Tantalum and Molybdenum Grown as Thin Films by the Atomic Layer Epitaxy Method," Thin Solid Films, 166 (1988) 149-154.

(Continued)

*Primary Examiner*—Hsien-ming Lee
*Assistant Examiner*—Kevin Parendo
(74) *Attorney, Agent, or Firm*—Knobbe, Martens, Olson & Bear LLP

(57) ABSTRACT

Titanium nitride (TiN) films are formed in a batch reactor using titanium chloride ($TiCl_4$) and ammonia ($NH_3$) as precursors. The $TiCl_4$ is flowed into the reactor in temporally separated pulses. The $NH_3$ can also be flowed into the reactor in temporally spaced pulses which alternate with the $TiCl_4$ pulses, or the $NH_3$ can be flowed continuously into the reactor while the $TiCl_4$ is introduced in pulses. The resulting TiN films exhibit low resistivity and good uniformity.

20 Claims, 8 Drawing Sheets

U.S. PATENT DOCUMENTS

| | | |
|---|---|---|
| 4,535,000 A | 8/1985 | Gordon |
| 4,570,328 A | 2/1986 | Price et al. |
| 4,585,671 A | 4/1986 | Kitagawa et al. |
| 4,684,542 A | 8/1987 | Jasinski et al. |
| 4,699,805 A | 10/1987 | Seelbach et al. |
| 4,715,937 A | 12/1987 | Moslehi et al. |
| 4,720,395 A | 1/1988 | Foster |
| 4,803,127 A | 2/1989 | Hakim |
| 4,828,224 A | 5/1989 | Crabb et al. |
| 4,834,020 A | 5/1989 | Bartholomew et al. |
| 4,851,095 A | 7/1989 | Scobey et al. |
| 4,855,254 A | 8/1989 | Eshita et al. |
| 4,935,661 A | 6/1990 | Heinecke et al. |
| 5,015,330 A | 5/1991 | Okumura et al. |
| 5,111,266 A | 5/1992 | Furumura et al. |
| 5,214,002 A | 5/1993 | Hayashi et al. |
| 5,221,556 A | 6/1993 | Hawkins et al. |
| 5,227,329 A | 7/1993 | Kobayashi et al. |
| 5,246,881 A | 9/1993 | Sandhu et al. |
| 5,279,857 A | 1/1994 | Eichman et al. |
| 5,287,205 A | 2/1994 | Yamazaki et al. |
| 5,308,655 A | 5/1994 | Eichman et al. |
| 5,356,673 A | 10/1994 | Schmitt et al. |
| 5,356,821 A | 10/1994 | Naruse et al. |
| 5,389,398 A | 2/1995 | Suzuki et al. |
| 5,389,570 A | 2/1995 | Shiozawa |
| 5,420,072 A * | 5/1995 | Fiordalice et al. ............ 438/607 |
| 5,453,858 A | 9/1995 | Yamazaki |
| 5,471,330 A | 11/1995 | Sarma |
| 5,591,494 A | 1/1997 | Sato et al. |
| 5,607,724 A | 3/1997 | Beinglass et al. |
| 5,614,257 A | 3/1997 | Beinglass et al. |
| 5,648,293 A | 7/1997 | Hayama et al. |
| 5,656,531 A | 8/1997 | Thakur et al. |
| 5,672,385 A | 9/1997 | Jimba et al. |
| 5,695,819 A | 12/1997 | Beinglass et al. |
| 5,698,771 A | 12/1997 | Shields et al. |
| 5,700,520 A | 12/1997 | Beinglass et al. |
| 5,741,330 A | 4/1998 | Brauker et al. |
| 5,769,950 A | 6/1998 | Takasu et al. |
| 5,786,027 A | 7/1998 | Rolfson |
| 5,789,030 A | 8/1998 | Rolfson |
| 5,837,580 A | 11/1998 | Thakur et al. |
| 5,849,601 A | 12/1998 | Yamazaki |
| 5,874,129 A | 2/1999 | Beinglass et al. |
| 5,876,797 A | 3/1999 | Beinglass et al. |
| 5,885,869 A | 3/1999 | Turner et al. |
| 5,907,792 A | 5/1999 | Droopad et al. |
| 5,916,365 A | 6/1999 | Sherman |
| 5,925,188 A | 7/1999 | Oh |
| 5,959,326 A | 9/1999 | Aiso et al. |
| 6,015,590 A | 1/2000 | Suntola et al. |
| 6,027,705 A | 2/2000 | Kitsuno et al. |
| 6,056,823 A | 5/2000 | Sajoto et al. |
| 6,083,810 A | 7/2000 | Obeng et al. |
| 6,087,229 A | 7/2000 | Aronowitz et al. |
| 6,103,600 A | 8/2000 | Ueda et al. |
| 6,136,654 A | 10/2000 | Kraft et al. |
| 6,159,828 A | 12/2000 | Ping et al. |
| 6,161,498 A | 12/2000 | Toraguchi et al. |
| 6,171,662 B1 | 1/2001 | Nakao |
| 6,197,669 B1 | 3/2001 | Twu et al. |
| 6,197,694 B1 | 3/2001 | Beinglass |
| 6,200,893 B1 | 3/2001 | Sneh |
| 6,203,613 B1 | 3/2001 | Gates et al. |
| 6,228,181 B1 | 5/2001 | Yamamoto et al. |
| 6,252,295 B1 | 6/2001 | Cote et al. |
| 6,271,054 B1 | 8/2001 | Ballantine et al. |
| 6,294,399 B1 | 9/2001 | Fukumi et al. |
| 6,326,311 B1 | 12/2001 | Ueda et al. |
| 6,373,112 B1 | 4/2002 | Murthy et al. |
| 6,385,020 B1 | 5/2002 | Shin et al. |
| 6,390,753 B1 | 5/2002 | De Ridder |
| 6,391,803 B1 | 5/2002 | Kim et al. |
| 6,436,820 B1 * | 8/2002 | Hu et al. .................... 438/656 |
| 6,455,892 B1 | 9/2002 | Okuno et al. |
| 6,468,924 B2 | 10/2002 | Lee et al. |
| 6,503,846 B1 | 1/2003 | Niimi et al. |
| 6,524,650 B1 | 2/2003 | Shimahara et al. |
| 6,528,530 B2 | 3/2003 | Zeitlin et al. |
| 6,537,910 B1 | 3/2003 | Burke et al. |
| 6,551,893 B1 | 4/2003 | Zheng et al. |
| 6,573,184 B2 | 6/2003 | Park |
| 6,585,823 B1 | 7/2003 | Van Wijck |
| 6,613,695 B2 | 9/2003 | Pomarede et al. |
| 6,638,879 B2 | 10/2003 | Hsich et al. |
| 6,656,282 B2 | 12/2003 | Kim et al. |
| 6,663,332 B1 | 12/2003 | Sluijk et al. |
| 6,814,572 B2 | 11/2004 | Okabe |
| 6,821,825 B2 | 11/2004 | Todd et al. |
| 6,824,816 B2 | 11/2004 | Aaltonen et al. |
| 6,825,134 B2 | 11/2004 | Law et al. |
| 6,924,223 B2 | 8/2005 | Yamasaki et al. |
| 6,962,859 B2 | 11/2005 | Todd et al. |
| 6,991,684 B2 | 1/2006 | Kannan et al. |
| 7,005,392 B2 | 2/2006 | Baum et al. |
| 7,125,582 B2 | 10/2006 | McSwiney et al. |
| 7,172,792 B2 | 2/2007 | Wang et al. |
| 7,192,626 B2 | 3/2007 | Dussarrat et al. |
| 7,297,641 B2 | 11/2007 | Todd et al. |
| 7,629,267 B2 | 12/2009 | Wan et al. |
| 2001/0025605 A1 | 10/2001 | Nagakura |
| 2002/0047151 A1 | 4/2002 | Kim et al. |
| 2002/0055270 A1 * | 5/2002 | Narwankar et al. ......... 438/776 |
| 2002/0073925 A1 | 6/2002 | Noble et al. |
| 2002/0098627 A1 | 7/2002 | Pomarede et al. |
| 2002/0121242 A1 | 9/2002 | Minami et al. |
| 2002/0124800 A1 | 9/2002 | Moriyama |
| 2002/0160605 A1 | 10/2002 | Kanzawa et al. |
| 2002/0168868 A1 | 11/2002 | Todd |
| 2002/0197831 A1 | 12/2002 | Todd et al. |
| 2003/0003686 A1 * | 1/2003 | Boyle et al. ................ 438/455 |
| 2003/0022528 A1 | 1/2003 | Todd |
| 2003/0059535 A1 | 3/2003 | Luo et al. |
| 2003/0082300 A1 | 5/2003 | Todd et al. |
| 2003/0111013 A1 | 6/2003 | Oosterlaken et al. |
| 2003/0134038 A1 | 7/2003 | Paranjpe |
| 2003/0143328 A1 | 7/2003 | Chen et al. |
| 2003/0143841 A1 | 7/2003 | Yang et al. |
| 2003/0148605 A1 | 8/2003 | Shimogaki et al. |
| 2003/0176047 A1 * | 9/2003 | Doan et al. ................. 438/478 |
| 2004/0025786 A1 | 2/2004 | Kontani et al. |
| 2004/0096582 A1 | 5/2004 | Wang et al. |
| 2004/0121596 A1 | 6/2004 | Pan et al. |
| 2004/0129212 A1 | 7/2004 | Gadgil et al. |
| 2004/0221807 A1 | 11/2004 | Verghese et al. |
| 2004/0224504 A1 | 11/2004 | Gadgil |
| 2004/0235191 A1 | 11/2004 | Hasegawa et al. |
| 2004/0235314 A1 | 11/2004 | Takimoto |
| 2004/0250765 A1 | 12/2004 | Ishizaka et al. |
| 2005/0039680 A1 | 2/2005 | Beaman et al. |
| 2005/0042373 A1 | 2/2005 | Kraus et al. |
| 2005/0045102 A1 | 3/2005 | Zheng et al. |
| 2005/0064684 A1 | 3/2005 | Todd et al. |
| 2005/0079692 A1 | 4/2005 | Samoilov et al. |
| 2005/0080286 A1 | 4/2005 | Wang et al. |
| 2005/0118837 A1 | 6/2005 | Todd et al. |
| 2005/0250302 A1 | 11/2005 | Todd et al. |
| 2005/0287806 A1 | 12/2005 | Matsuura |
| 2006/0060137 A1 | 3/2006 | Hasper et al. |
| 2006/0068104 A1 | 3/2006 | Ishizaka et al. |
| 2006/0084283 A1 | 4/2006 | Paranjpe et al. |
| 2006/0088985 A1 | 4/2006 | Haverkort et al. |
| 2006/0189168 A1 | 8/2006 | Sato et al. |

| | | | |
|---|---|---|---|
| 2006/0193980 | A1 | 8/2006 | Hasegawa et al. |
| 2007/0077775 | A1 | 4/2007 | Hasper et al. |
| 2007/0084404 | A1 | 4/2007 | Verghese et al. |
| 2008/0003838 | A1 | 1/2008 | Haukka et al. |

FOREIGN PATENT DOCUMENTS

| | | | |
|---|---|---|---|
| EP | 0 368 651 | A2 | 5/1990 |
| EP | 0 442 490 | A1 | 8/1991 |
| EP | 0 486 047 | A2 | 5/1992 |
| EP | 0526779 | A1 | 2/1993 |
| EP | 0 747 974 | A2 | 12/1996 |
| EP | 1 065 728 | A1 | 1/2001 |
| GB | 2 332 564 | A | 6/1999 |
| JP | 59078919 | A | 1/1982 |
| JP | 57209810 | A | 12/1982 |
| JP | 59078918 | A | 5/1984 |
| JP | 60043485 | A | 3/1985 |
| JP | 60-245233 | | 12/1985 |
| JP | 61153277 | A | 7/1986 |
| JP | 62076612 | A | 4/1987 |
| JP | 63003414 | A | 1/1988 |
| JP | 63003463 | A | 1/1988 |
| JP | 64-081311 | | 3/1989 |
| JP | 1217956 | A | 8/1989 |
| JP | 1268064 | A | 10/1989 |
| JP | 2155225 | A | 6/1990 |
| JP | 3091239 | A | 4/1991 |
| JP | 3185817 | A | 8/1991 |
| JP | 3187215 | A | 8/1991 |
| JP | 3292741 | A | 12/1991 |
| JP | 4323834 | A | 11/1992 |
| JP | 5021378 | A | 1/1993 |
| JP | 5062911 | A | 3/1993 |
| JP | 7249618 | A | 9/1995 |
| JP | 8242006 | A | 9/1996 |
| JP | 11317530 | | 11/1999 |
| JP | 2002-367992 | | 12/2002 |
| JP | 2003-077864 | | 3/2003 |
| JP | 2003-297818 | | 10/2003 |
| JP | 2004-23043 | | 1/2004 |
| JP | 2004-096060 | | 3/2004 |
| WO | WO 02/064853 | A2 | 8/2002 |
| WO | WO 03/008663 | A1 | 1/2003 |
| WO | WO 2004/008491 | A2 | 1/2004 |
| WO | WO 2004/008491 | A3 | 1/2004 |
| WO | WO 2004/009861 | A2 | 1/2004 |
| WO | WO 2004/074543 | | 9/2004 |

OTHER PUBLICATIONS

Hillman et al., "Properties of LPCVD TiN Barrier Layers," Microelectronic Engineering 19 (1992) 375-378.

Hiramatsu et al., Formation of TiN Films with Low Cl Concentration by Pulsed Plasma Chemical Vapor Deposition, J. Vac. Sci. Technol. A, 14(3) May/Jun. 1996.
Ikoma et al., Growth of Si/3C-SiC/Si(100) hetrostructures by pulsed supersonic free jets, Applied Physics Letters, vol. 75, No. 25, pp. 3977-3979, Dec. 1999.
International Search Report dated Nov. 13, 2003 for international patent application No. PCT/US02/02921, filed on Feb. 1, 2002.
Iyer, R. Suryanarayanan et al., "A Process Method of Silicon Nitride Atomic Layer Cyclic Deposition," Semicon Taiwan 2001, pp. 17-25.
Nakano et al., "Digital Chemical Vapor Deposition of $SiO_2$," Appl Phys. Lett. 57 (11) Sep. 1990, pp. 1096-1098.
Olivares, J. et al., "Solid-phase crystallization of amorphous SiGe films deposed by LPCVD on SiOs and glass," *Thin Solid Films* 337 (1999), pp. 51-54.
Ramanuja, et al., "Synthesis and characterization of low pressure chemically vapor deposited titanium nitride films using $TiCl_4$ and $NH_3$," Materials Letters 57 (2002) 261-269.
Sakaue et al., Digital Chemical Vapor Deposition of $SiO_2$ Using a Repetitive Reaction of Triethylsilane/Hydrogen and Oxidation, Japanese Journal of Applied Materials, vol. 30, No. 1 B, Jan. 1990, pp. L124-L127.
Sze, VLSI Technology, "Arrhenius plot for polysilicon deposition for different silane partial pressures," (1988) pp. 240-241.
Office Action of Dec. 22, 2008 in U.S. Appl. No. 11/096,861, filed Mar. 31, 2005.
Office Action of Jun. 13, 2008 in U.S. Appl. No. 11/096,861, filed Mar. 31, 2005.
European Search Report for counterpart EP Application No. 05011705.
Pintchovski et al., "LPCVD titanium nitride-deposition, properties, and application to ULSI", *Tungsten and Other Refractory Metal for ULSI Application*, No. IV, pp. 275-282, (1989).
Travis et al., "A scalable submicron contact technology using conformal LPCVD TiN", *iIDEM Conference Proceedings*, Dec. 1990.
Ishihara et al., "Low-temperature chemical-vapor-deposition of silicon-nitride from tetra-silane and hydrogen azide," *Materials Research Society Symposium Proceedings*, vol. 284, p. 3-8 (1993).
Kanoh et al., "Low-temperature chemical-vapor-deposition of silicon nitride," *Journal de Physique IV*, vol. 2, p. C2-831-C2-837 (1991).
Yeh et al., "Low-temperature chemical-vapor-deposition of silicon-nitride film from hexachloro-disilane and hydrazine," *Jpn. J. Appl. Phys.* vol. 35, Part 1, No. 2B, p. 1509-1512 (Feb. 1996).
Office Action of Jul. 9, 2009 in U.S. Appl. No. 11/096,961, filed Mar. 31, 2005.
Office Action of Jul. 9, 2009 in U.S. Appl. No. 11/096,861, filed Mar. 31, 2005.
Office Action issued Jan. 7, 2010 in counterpart U.S. Appl. No. 11/096,861.

* cited by examiner

US 7,732,350 B2

CHEMICAL VAPOR DEPOSITION OF TiN FILMS IN A BATCH REACTOR

REFERENCE TO RELATED APPLICATION

This application is a continuation of U.S. patent application Ser. No. 11/096,861, filed Mar. 31, 2005, entitled Deposition of TiN Films in a Batch Reactor, which claims the priority benefit under 35 U.S.C. §119(e) of U.S. provisional Application No. 60/612,332, filed Sep. 22, 2004.

BACKGROUND OF THE INVENTION

1. Field of the Invention

This invention relates generally to semiconductor fabrication and, more particularly, to forming titanium nitride films.

2. Description of the Related Art

For various reasons, including low electrical resistivity, good thermal stability and good diffusion barrier properties, there are numerous applications for titanium nitride (TiN) in the fabrication of integrated circuits. Exemplary applications include use as a contact or barrier layer and as an electrode in electrical devices, such as transistors.

The properties of TiN, however, are closely dependent on processing and deposition parameters. Thus, the suitability and desirability of deposited TiN for a particular application can depend on the availability of a deposition process able to form TiN with desired properties, e.g., high uniformity and low resistivity. As a result, research into the development of new TiN deposition processes is on-going.

For example, the Low Pressure Chemical Vapor Deposition (LPCVD) of TiN films in a hot wall furnace has recently been described by N. Ramanuja et al. in Materials Letters, Vol. 57 (2002), pp. 261-269. The reach of Ramanuja et al. is limited, however, as Ramanuja et al. investigated 100 mm wafers, rather than industry standard 200 mm and 300 mm wafers. Given the sensitivity of TiN films to deposition conditions, a need still remains for a process that is able to deposit TiN films with good uniformity and low resistivity on industry size wafers, such as 200 mm or 300 mm wafers.

In addition to being able to form acceptable TiN films, it is desirable for the deposition temperature of the TiN deposition process to be relatively low, thereby increasing flexibility for integrating the deposition process with other processes and structures. For example, reducing deposition temperatures to the 400-500° C. range would allow the films to be used in conjunction with multi-level aluminum or copper metallization.

It has been found, however, that a reduction in the deposition temperature results in the incorporation of significant amounts of chlorine in the TiN film and results in a substantial increase in resistivity, which is undesirable. See J. T. Hillman, Microelectronic Engineering, Vol. 19 (1992), pp. 375-378. To reduce the resistivity and the chlorine content of the film, Hilman discloses a single wafer deposition process followed by a post-deposition anneal. Undesirably, however, such a process requires an additional process step and also limits throughput by using single wafer processing.

Accordingly, there is a need for an economical, relatively high throughput process for depositing TiN films having good uniformity and low resistivity.

SUMMARY OF THE INVENTION

According to one aspect of the invention, a method is provided for forming a titanium nitride film. The method comprises providing a vertical furnace having a reaction chamber which is configured to accommodate 25 or more substrates. A plurality of semiconductor substrates is provided in the reaction chamber. A titanium precursor is flowed into the reaction chamber in temporally separated pulses and a nitrogen precursor is flowed into the reaction chamber.

According to another aspect of the invention, a process for depositing a titanium nitride film is provided. The process comprises chemical vapor depositing titanium nitride on a substrate in a reaction chamber by exposing the substrate to a nitrogen precursor and to a titanium precursor. One of the nitrogen precursor and the titanium precursor is flowed into the reaction chamber in temporally spaced pulses, while the other of the nitrogen precursor and the titanium precursor is continuously flowed into the reaction chamber during and between the temporally spaced pulses.

According to another aspect of the invention, a batch reactor is provided. The reactor comprises a reaction chamber configured to accommodate 25 or more semiconductor substrates. The reaction chamber has a gas inlet. The reactor also comprises a gas delivery system programmed to deliver titanium chloride through the inlet and into the reaction chamber in temporally separated pulses.

According to another aspect of the invention, a batch reactor is provided. The reactor comprises a vertically extending reaction chamber configured to accommodate a plurality of vertically spaced semiconductor substrates. The chamber has a top end and a bottom end. The reactor also comprises a purge gas injector accommodated inside the chamber. The purge gas injector extends upwardly from proximate the bottom end of the reactor and has an opening to the reaction chamber proximate the top end of reaction chamber. The purge gas injector is connected to a feed for purge gas and is configured to expel substantially all purge gas flowing through the purge gas injector out of the opening. At least one reactant gas injector is accommodated in the reaction chamber. The reactant gas injector extends substantially over a height of the chamber and is connected to a process gas delivery system. The process gas delivery system is configured to deliver two process gases to the reaction chamber, one process gas through the at least one injector. The reactor also comprises a gas exhaust proximate the bottom end of the reaction chamber.

BRIEF DESCRIPTION OF THE DRAWINGS

The invention will be better understood from the Detailed Description of the Preferred Embodiments and from the appended drawings, which are meant to illustrate and not to limit the invention, and wherein.

DETAILED DESCRIPTION OF THE PREFERRED EMBODIMENT

Figure 1:
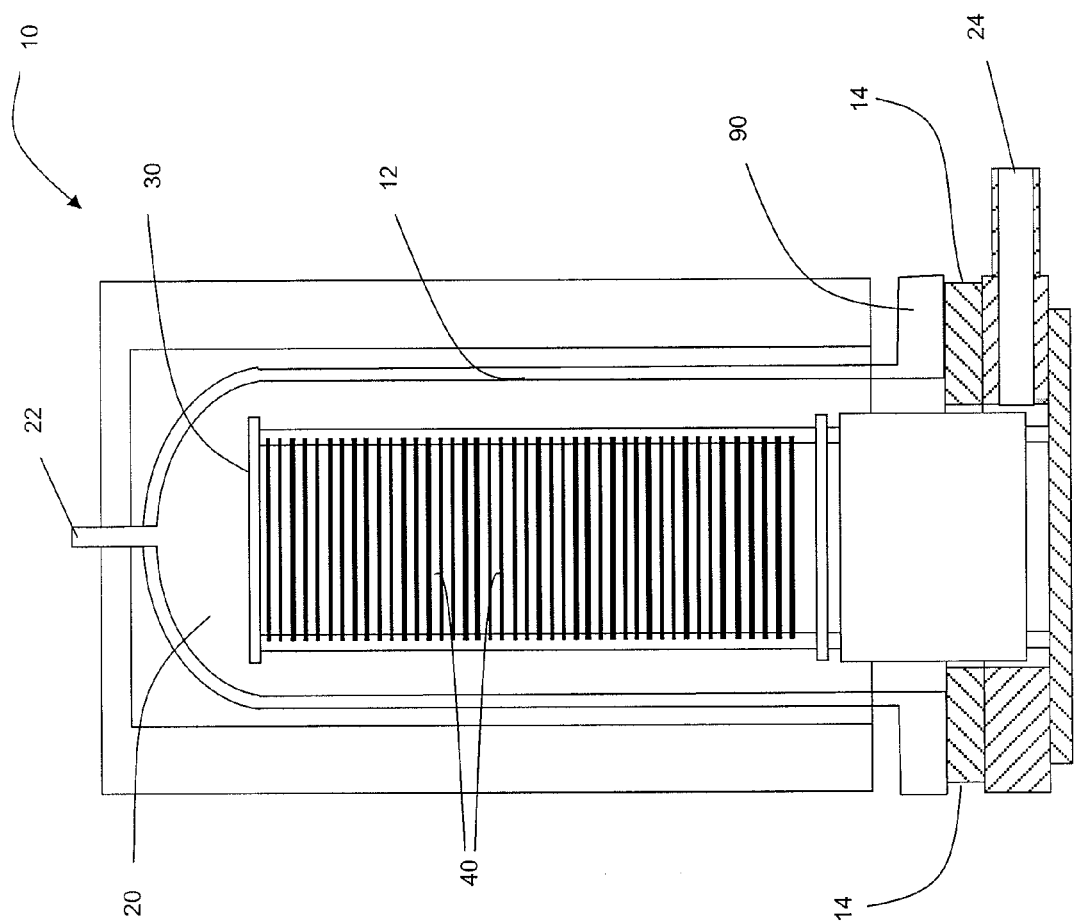
FIG. 1 illustrates an exemplary furnace for use with preferred embodiments of the invention.

It has been found that uniform and low resistivity TiN films can be deposited in a batch reactor by periodically introducing, or pulsing, one or more precursors into the reaction chamber of the reactor. Preferably, the TiN films are formed using stable titanium and nitrogen precursors, i.e., precursors which are not radicals or a plasma. More preferably, titanium tetrachloride ($TiCl_4$) and ammonia ($NH_3$) are used as the titanium and nitrogen precursors, respectively. Both precursors (e.g., $TiCl_4$ and $NH_3$) are alternately pulsed into the reaction chamber or only one precursor is pulsed while the other precursor is flowed continuously into the reaction chamber. In some preferred embodiments, the titanium precursor, e.g., $TiCl_4$, is pulsed into the reaction chamber while the nitrogen precursor, e.g., $NH_3$, is flowed continuously into the chamber.

The deposition advantageously can be performed at a temperature of less than about 600° C. and, more preferably, at less than about 500° C., e.g., about 450-500° C. Thus, the deposition is compatible with other processes such as multi-level aluminum or copper metallization. In addition, the deposition can advantageously be used to deposit films on industry standard 200 mm and 300 mm wafers.

Preferably, the deposition is performed in a batch reactor configured or programmed to deliver one or more precursors in temporally separated pulses. The batch reactor preferably has a vertically extending reaction chamber which accommodates substrates vertically separated from each other, with major faces of the substrates oriented horizontally. Preferably, the reaction chamber accommodates 25 or more and, more preferably, 50 or more substrates. The illustrated vertical furnace, discussed below, is adapted to support 100-125 substrates.

In some preferred embodiments of the invention, a stack of vertically-spaced substrates, e.g., semiconductors wafers, is accommodated in a batch reaction chamber and temporally separated pulses of the titanium and nitrogen precursors, such as $TiCl_4$ and $NH_3$, are supplied to the reaction chamber alternatingly and sequentially in an atomic layer deposition of TiN. The deposition rate of the TiN has been found to be particularly sensitive to variations in the gas partial pressure of $NH_3$. As a result, $NH_3$ is preferably flowed into the chamber using a gas injector having vertically distributed holes to allow an even distribution of the $NH_3$. Preferably, each reactant is removed, e.g., by purging with an inert gas or evacuating the reaction chamber, before introduction of the other reactant. The duration of each of the pulses is about 60 seconds or less and, more preferably, about 30 seconds or less and, most preferably, about 15 seconds or less.

In other preferred embodiments, the nitrogen precursor, e.g., $NH_3$, is continuously supplied to the reaction chamber and only the titanium precursor, e.g., $TiCl_4$, is supplied pulse-wise. Advantageously, such a deposition scheme allows an increased deposition rate per reactant pulse without losing film quality, in comparison to a scheme in which both $TiCl_4$ and $NH_3$ are alternately pulsed. By continuously flowing one precursor, more than one monolayer of TiN is typically deposited per $TiCl_4$ pulse. In addition, where the titanium precursor pulses are relatively short, the deposited titanium-containing films are effectively nitrided by the nitrogen precursor flow between the titanium precursor pulses. Thus, high quality, low resistivity and uniform TiN films can be obtained at relatively low deposition temperatures of preferably less than about 600° C., and, more preferably, less than about 500° C., e.g., about 450° C. Preferably, the pulse duration is about 60 seconds or less, more preferably, about 30 seconds or less and, most preferably, about 15 seconds or less.

Advantageously, high quality titanium nitride films can be formed in accordance with the preferred embodiments. For example, the thicknesses of deposited titanium nitride films can vary by less than about 3 nm between substrates in a batch of substrates, and the resistivity can vary by less than about 5 μOhm·cm. Moreover, the films can be formed having a low resisitivity of about 220 μOhm·cm or less.

Reference will now be made to the Figures, in which like numerals refer to like parts throughout.

With reference to FIG. 1, the illustrated reactor 10 is a vertical furnace reactor, which accommodates substrates 40 vertically separated from one another and which has benefits for efficient heating and loading sequences. Examples of suitable vertical furnaces are the A400™ and A412™ vertical furnaces, commercially available from ASM International, N.V. of Bilthoven, the Netherlands. It will be understood, however, that while preferred embodiments are presented in the context of a vertical batch furnace, the principles and advantages disclosed herein will have application to other types of reactors, some of which are further discussed below.

With continued reference to FIG. 1, a tube 12 defines a reaction chamber 20 in the interior of the vertical furnace or reactor 10. The lower end of the tube 12 terminates in a flange 90, which mechanically seals the chamber 20 by contact with a lower support surface 14. Process gases can be fed into the reaction chamber 20 through a gas inlet 22 at the top of the chamber 20 and evacuated out of the chamber 20 through a gas outlet 24 at the bottom of the chamber 20. The reaction chamber 20 accommodates a wafer boat 30 holding a stack of vertically spaced substrates or wafers 40.

The process tube flange 90 can be maintained at an elevated temperature to avoid condensation of process gases on it. It will be appreciated that the elevated temperature can vary from process to process and is preferably chosen based upon the identities of the process gases. Regulation of the temperature of the flange 90 can be achieved by providing it with electrical heaters and a water-cooling system. The water-cooling is desired primarily to avoid overheating of the flange 90 during unloading of a batch of hot wafers 40.

Various systems can be used to supply reactants or precursors to the reaction chamber 20 (FIG. 1). For example, where the precursor is a gas, it can be flowed directly from a gas source to the chamber 20. The timing and rate of the flow of the gas can be controlled by, e.g., mass flow controllers, as known in the art.

Where the precursor, such as $TiCl_4$, is stored as a liquid, a bubbler can be used to supply the precursor to the chamber 20 in gaseous form. The timing and rate of flow of such a precursor can be regulated by controlling the flow of carrier gas through the liquid in the bubbler and by controlling the temperature of the liquid. It will be appreciated that the quantity of the liquid precursor carried by the carrier gas increases with increasing temperature.

Figure 2:
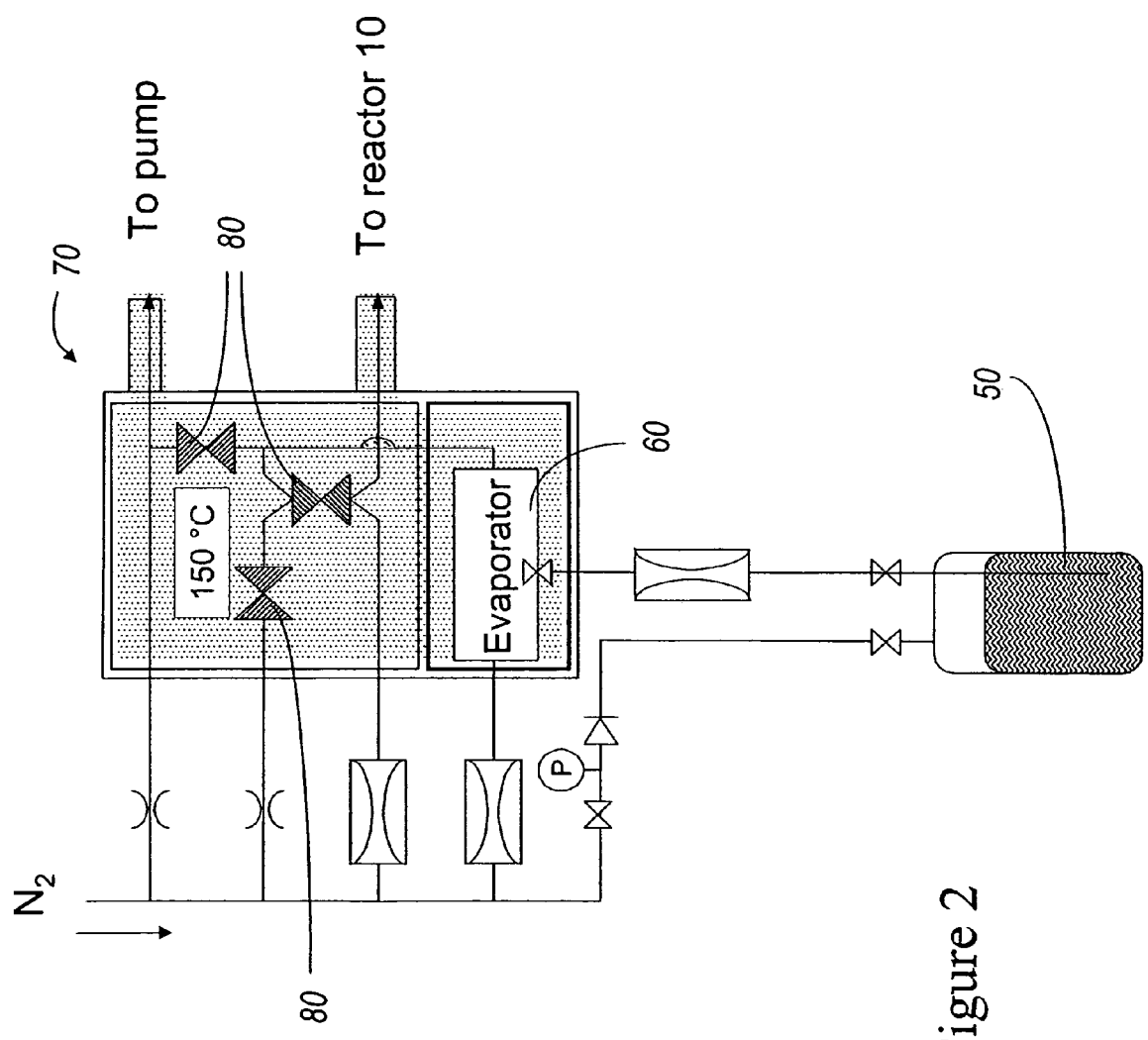
FIG. 2 illustrates an exemplary liquid delivery system for use with preferred embodiments of the invention.

Another exemplary system for controlling the flow of liquid precursors, such as $TiCl_4$, is shown schematically in FIG. 2. The liquid precursor is stored in a container 50. Liquid flow control is used to regulate the amount of the liquid precursor flowing into the reactor 10 by regulating the flow of the liquid into an evaporator or vaporizer 60. After being vaporized, well-separated pulses of a precursor can be generated and flowed into the reaction chamber 20 using a valve system 70 comprising valves 80, shown in the upper section of FIG. 2. Preferably, the valves 80 of the valve system 70 are operated at elevated temperatures and have no or minimal dead volume, to provide good separation between the flow of different reactants. Such a valve system is described in further detail in U.S. patent application Ser. No. 10/864,260, filed Jun. 9, 2004, the entire disclosure of which is incorporated herein by reference.

With reference to FIGS. 3-6, the deposition results of various deposition schemes discussed above were investigated using $TiCl_4$ and $NH_3$ as reactants. The depositions were performed in an A400™ or A412™ vertical furnace from ASM International, N.V., of Bilthoven, the Netherlands, schematically illustrated in FIG. 1. Wafers 40 having a diameter of 200 mm were supported on the wafer boat 30 in the furnace 10.

The wafer spacing on the wafer boat 30 was varied depending upon the precursor pulse scheme. For experiments in which $TiCl_4$ and $NH_3$ were alternately pulsed into the reaction chamber 20, the vertical spacing of the 200 mm diameter wafers was about 4.76 mm and the total number of wafers was 125. It will be appreciated that wafers 40 at the top and bottom of the wafer boat 30 are typically not used for further processing. Rather, they may be used for testing and/or are not further processed due to sub-optimal deposition results at the extremes of the reaction chamber 20. Thus, out of a total of 125 wafers, 100 wafers are typically "product wafers" which are to be further processed for completion of integrated circuits.

For experiments in which one precursor was pulsed while a continuous flow of the other precursor was maintained, the spacing of the 200 mm wafers 40 was twice as large as in experiments where both precursors were alternately pulsed. Thus, the spacing was about 9.54 mm. This resulted in a total load size of 63 wafers and a 50 wafer product load size.

In some experiments a bubbler was used to deliver $TiCl_4$ vapor to the reaction chamber 20. The flow of $TiCl_4$ vapor to the reaction chamber 20 was controlled by controlling the temperature of the $TiCl_4$ container (not shown) connected to the inlet 22 (FIG. 1). A flow of 250 sccm $N_2$ carrier gas was bubbled through the $TiCl_4$ container. In most experiments the $TiCl_4$ container was controlled at about 28° C. In other experiments, the system schematically shown in FIG. 2 was used for controlling the flow of liquid $TiCl_4$ through an evaporator 60 and for pulsing the $TiCl_4$.

During processing, as discussed above, the process tube flange 90 (FIG. 1) can be maintained at an elevated temperature, preferably above 120° C., preferably about 180-200° C., to avoid condensation of material on the flange 90.

In atomic layer deposition experiments where both precursors were alternately pulsed, the pulse sequence and timing was as follows:

| | | |
|---|---|---|
| $TiCl_4$ pulse | 15 sec. | |
| $N_2$ purge | 17 sec./5 slm | |
| $NH_3$ pulse | 30 sec./1 slm | |
| $N_2$ purge | 17 sec./5 slm | |

The cycle time was 79 seconds and the total recipe time was 18 hours and 30 minutes. Accounting for 1 hour of the recipe time as overhead in which deposition did not occur, the deposition time was 17 hours and 30 minutes. A total of 795 cycles of deposition by alternating precursor flows was performed. The depositions were performed at substrate temperatures of 450° C. and 600° C. At a deposition temperature of 450° C., about 0.029 nm of TiN was deposited per cycle, resulting in a deposited film thickness of about 23 nm. Notably, the deposited thickness per cycle is less than 1 Å/cycle (0.1 nm/cycle), which is typical of atomic layer deposition (ALD) processes.

Figure 3:
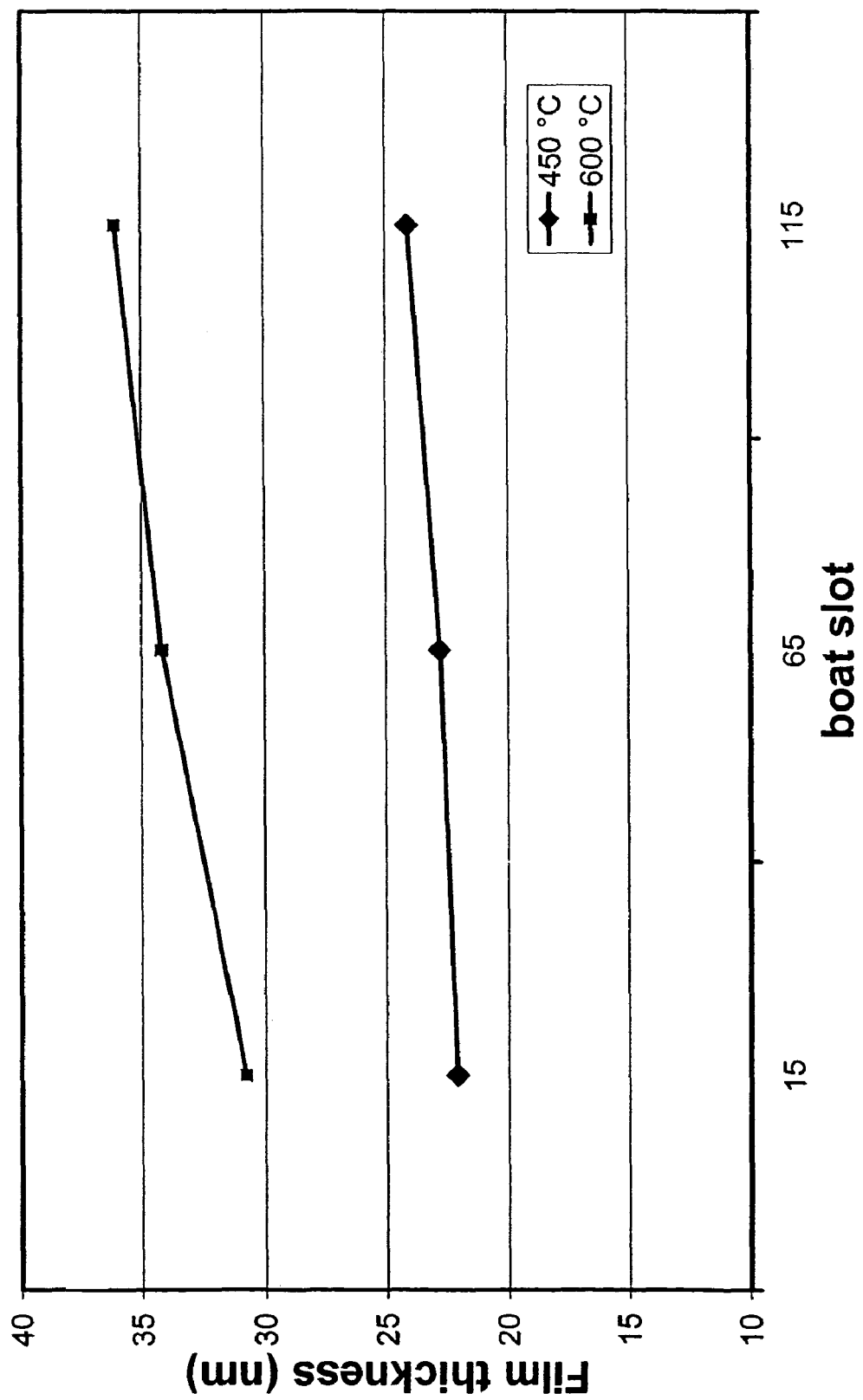
FIG. 3 is a graph showing film thickness results at different vertical substrate positions for a batch of semiconductor substrates processed at two different temperatures in accordance with one preferred embodiment of the invention.
Figure 4:
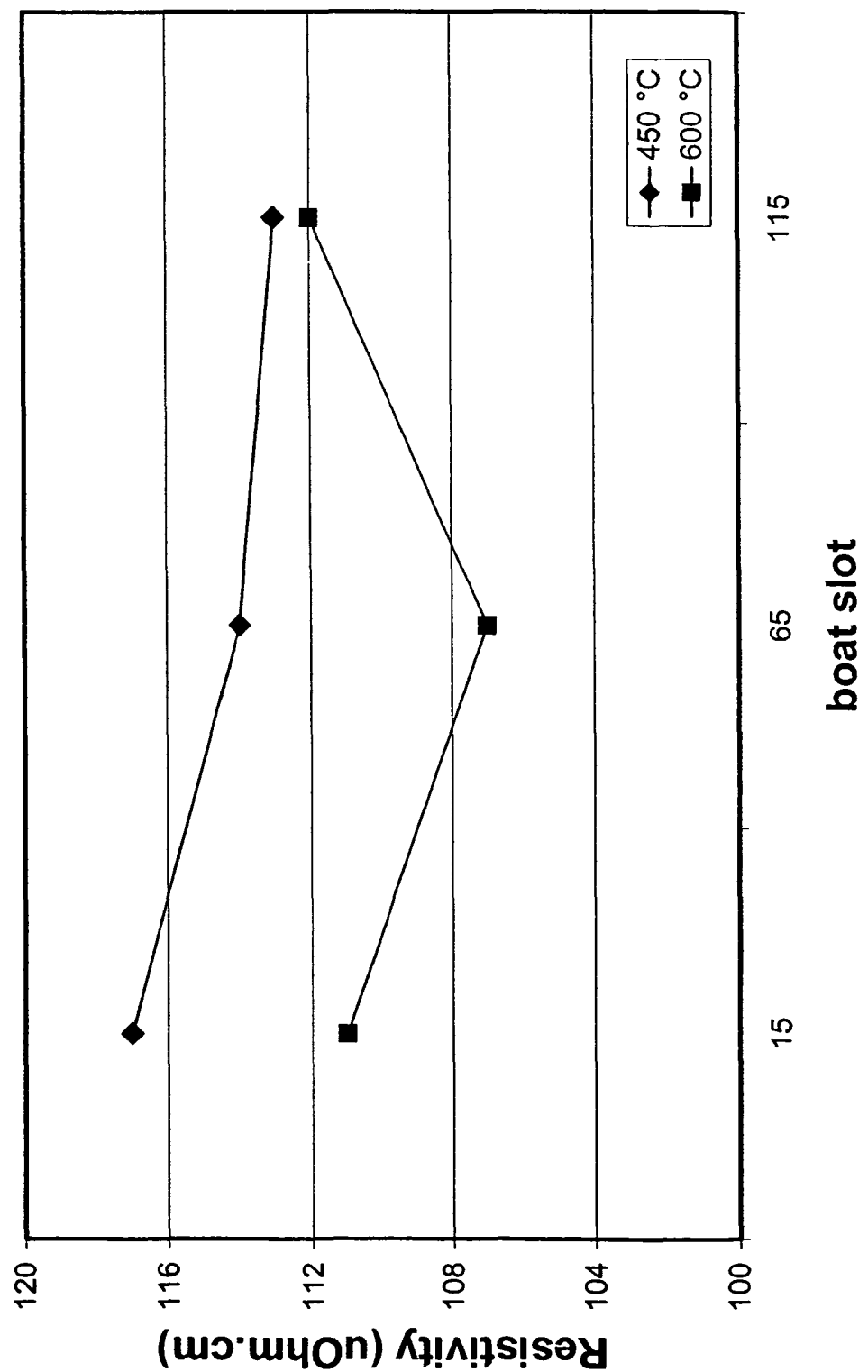
FIG. 4 is a graph showing film resistivity results at different vertical substrate positions for the semiconductor substrates of FIG. 3.

The thickness results are shown in FIG. 3 and the resistivity results are shown in FIG. 4. Advantageously, at the lower 450° C. deposition temperature, the average film thickness across a wafer was found to be exceptionally uniform from wafer to wafer, varying less than about 3 nm among the various wafers of a batch of wafers. At this temperature, the average resistivity of the films was also found to be advantageously uniform, varying less than about 5 μOhm·cm among the various wafers in the batch.

Figure 5:
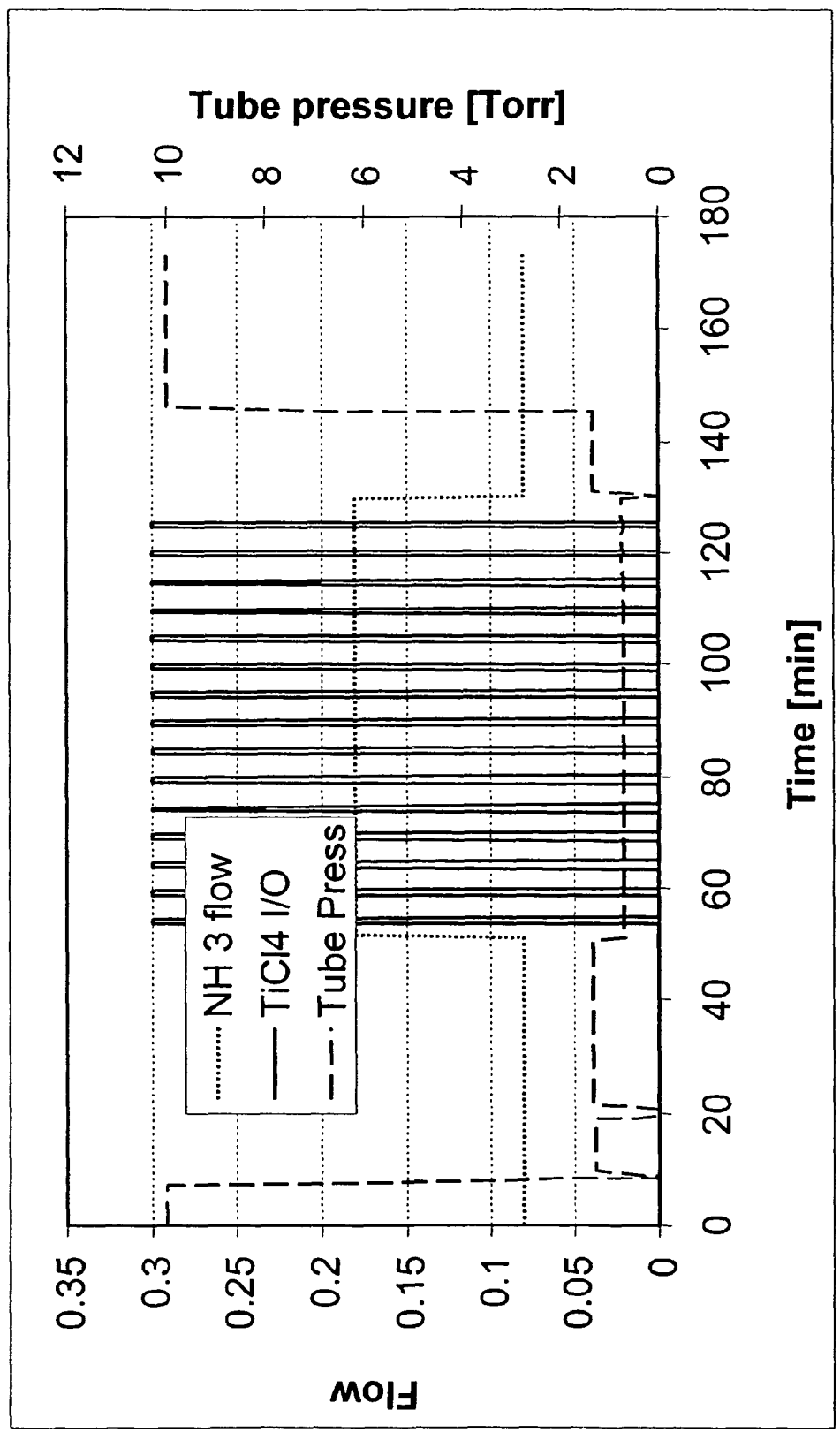
FIG. 5 is a graph illustrating the timing of the flow of reactants, in accordance with another embodiment of the invention.

In other experiments, pulsed CVD process runs, in which a continuous flow of $NH_3$ was fed into the reaction chamber and $TiCl_4$ was pulsed, were performed. FIG. 5 shows the tube pressure, flow rate and pulse timing for each precursor. The deposition temperature was 450° C., the $TiCl_4$ bubbler temperature was 28° C. and the time between $TiCl_4$ pulses was 4 minutes. The number of pulses was chosen such that the total $TiCl_4$ exposure time amounted to 15 minutes. Thus, for a 60 second $TiCl_4$ pulse time the total number of pulses was 15, for a 30 second pulse time the total number of pulses was 30, and for a 15 second pulse time the total number of pulses was 60. The $NH_3$ flow was constant at about 0.2 slm during processing.

Figure 6:
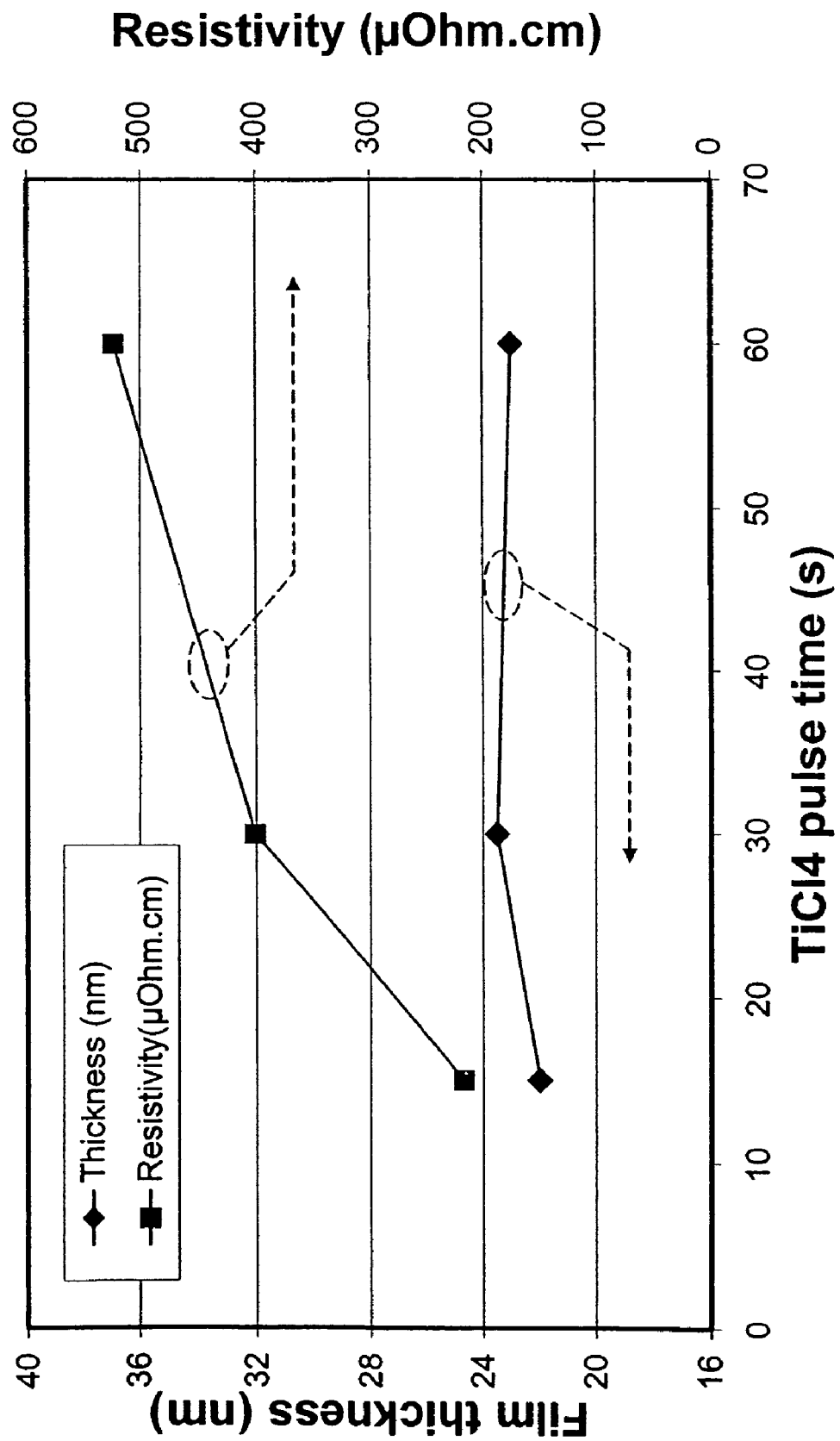
FIG. 6 is a graph showing film thicknesses and resistivities as a function of the duration of the flow of $TiCl_4$ for each $TiCl_4$ pulse into a reaction chamber.

For the deposition scheme of FIG. 5, FIG. 6 shows the effects of pulse time on film thickness and resistivity. While longer pulse times would be expected to increase or possibly not affect the thickness of the deposited film in cases where the total $TiCl_4$ exposure time was unchanged, it was unexpectedly found that pulse times longer than about 30 seconds actually caused a decrease in average film thickness from about 23.5 nm to about 23 nm. Even more unexpectedly, the average resistivity of the deposited film was strongly dependent on pulse times. In particular, film resistivity increased from about 220 μOhm·cm for $TiCl_4$ pulse durations of about 15 seconds to about 520 μOhm·cm for $TiCl_4$ pulse durations of about 60 seconds. Thus, shorter pulse times advantageously allowed deposition of TiN films with reduced resistivity, e.g., about 220 μOhm·cm or less.

In addition, the cycle duration can be selected to give a desired TiN film resistivity. For example, resistivities of about 520 μOhm·cm to about 220 μOhm·cm can be achieved by appropriately adjusting the $TiCl_4$ pulse time between about 15 seconds and about 60 seconds, or the duration of each cycle of process gases can be adjusted between about 1 minute and about 10 minutes. In the exemplary process of FIG. 5, the cycle duration was about 5 minutes (60 second $TiCl_4$ pulse time+4 minutes between $TiCl_4$ pulses).

As noted above, process gases can be introduced into the chamber 20 in various ways. For example, in the reactor illustrated in FIG. 1, all gases are introduced into the interior 20 of the reactor 10 at the top, via the top inlet 22, and exhausted at the bottom of the reactor 10, via the exhaust 24.

In other embodiments, a more even distribution of the process gases can be achieved over the length of the tube by using multiple hole injectors for introduction of process gases into the reactor. Suitable multiple hole injectors are disclosed in U.S. Pat. No. 6,746,240, issued Jun. 8, 2004, and U.S. Patent Application Publication No. 2003/0111013 A1, the entire disclosures of which are incorporated by reference herein. Alternatively, less spacious and cylindrical multiple hole injectors can be used. Such injectors can have, e.g., a diameter of about 25 mm and holes of about 1 mm diameter. In some preferred embodiments, multiple hole injectors are preferably mounted on or beneath the flange 90 at the lower end of the reaction chamber 20 and point upwardly.

A multiple hole injector is preferably not used to introduce a purge gas, however, because the top part of the reaction chamber 20 may be not effectively purged by an injector that only extends part way up the height of the chamber 20. Preferably, a purge gas is introduced into the chamber 20 at the chamber end that is opposite to the exhaust end, so that the purge gas flows through all regions of the reaction chamber 20 after entry and before being exhausted.

Figure 7:
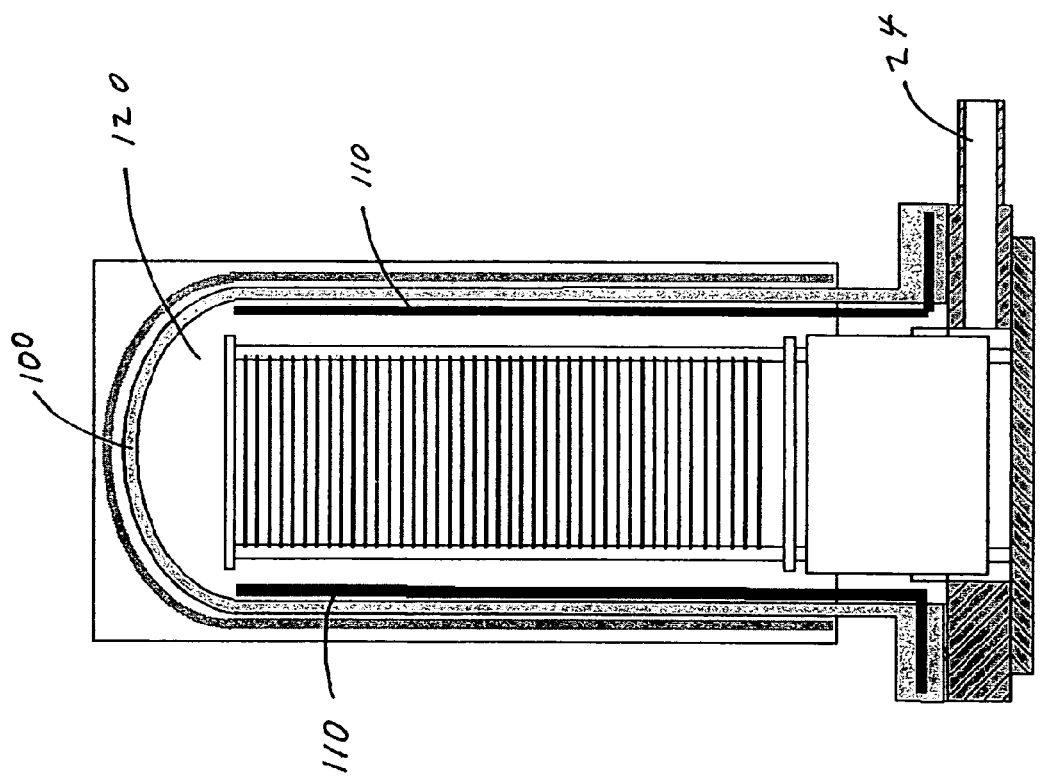
FIG. 7 illustrates another exemplary furnace for use with preferred embodiments of the invention.

Another exemplary reactor set-up is shown in FIG. 7. In this design, the process tube 100 is closed at the top. An advantage of this design is that the process tube 100 is simpler in construction and eventual problems with the gas-tightness and the thermal isolation of the top inlet 22 (FIG. 1) can be prevented. All gases in this set-up are introduced through gas injectors 110, of which two are shown. Preferably, separate injectors 110 are used for each gas. In the case of TiN deposition with $TiCl_4$ and $NH_3$, one injector 110 is used for each of the process gases. These injectors 110 are preferably multiple hole gas injectors having holes distributed over the height of the tube 100, as discussed above.

Figure 8:
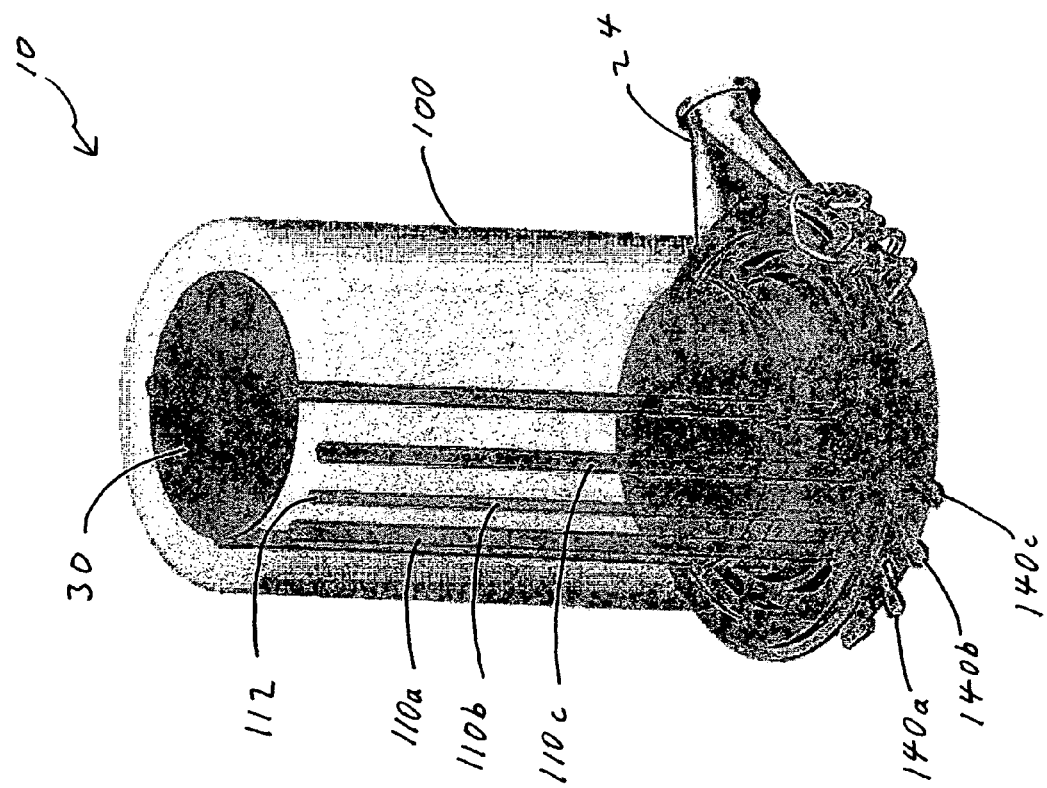
FIG. 8 illustrates an additional exemplary furnace for use with preferred embodiments of the invention.

An additional injector 110 can be used for a purge gas, preferably an inert gas such as nitrogen gas. The injector 110 for the purge gas is preferably a tube with an open end at the top and without gas discharge holes in its sidewall, so that all the purge gas is discharged at the top of the reaction chamber 120. FIG. 8 illustrates a reactor 10 having three vertically extending injectors, 110a, 110b and 110c. The injectors 100a, 100b and 110c each have an inlet 140a, 140b, and 140c, respectively, for connecting to one or more gas feeds. The injector 110b opens at its top end 112 to allow purge gas to flow downward through the reactor 10 and to exit out the exhaust 24 at the bottom of the reactor 10. In other embodiments, the exhaust 24 can be at the top of the reaction chamber 120 and the purge gas can be discharged at the bottom of the reaction chamber 120. In yet other embodiments, a reaction chamber configuration having an outer process tube and an inner liner can be used. Gas flows in an upward direction inside the liner to the top of the chamber and flows in a downward direction toward an exhaust in a space between the outer surface of the liner and an inner surface of the process tube. The multiple hole injectors are placed inside the liner and a purge gas injector may not be needed. An example of such a reaction chamber configuration is disclosed in U.S. Patent Application Publication No. 2003/0111013 A1, the entire disclosure of which is incorporated herein by reference.

Advantageously, using such multiple hole gas injectors, the evenness of gas distribution into the reaction chamber can be improved, thereby improving the uniformity of deposition results.

For example, in experiments in which TiN films were formed by continuous CVD, by continuously flowing $TiCl_4$ and $NH_3$ into a reaction, it was found that the deposition rate of the TiN films did not vary significantly with the partial pressure of the $TiCl_4$. On the other hand, the deposition rate appeared to be approximately proportional to the partial pressure of the $NH_3$. For depositing uniform films, these experiments indicate that the mode of introduction and distribution of $NH_3$ inside the reaction chamber is more important than that for $TiCl_4$, whether or not $NH_3$ is pulsed into the chamber, e.g., whether or not $NH_3$ is used in an ALD or pulsed CVD process. As a result, $NH_3$ is preferably discharged into the reaction chamber in a manner that maximizes the evenness of the distribution of the gas into the chamber. $NH_3$ is preferably discharged into the vertical furnace reaction chamber in a vertically distributed manner, e.g., through a multiple hole injector having a plurality of vertically spaced apart holes, such as those discussed above. The injector preferably extends substantially over a height of the chamber, such that the holes of the injector span the vertical height occupied by the substrates. $TiCl_4$ can also be discharged using the multiple hole injector, or it can be discharged at a feed end of the reaction chamber (FIG. 1).

Example

An exemplary process for pulsed CVD of TiN films using the reactor hardware configuration of FIGS. 7 and 8 and a $TiCl_4$ liquid flow control and evaporation unit according to FIG. 2 will now be given. A liquid flow of 0.35 g/min. $TiCl_4$ into the evaporator was applied. Upstream of the evaporator, a flow of 200 sccm $N_2$ was added to the liquid and downstream of the evaporator an additional flow of 100 sccm $N_2$ was added to the evaporated $TiCl_4$. The $TiCl_4$ pulse time was 1 minute. The $TiCl_4/N_2$ mixture was discharged into the reaction chamber through a multiple hole injector having 30 vertically spaced holes with a diameter of 1 mm or less. During the $TiCl_4$ pulse a mixture of 187 sccm $NH_3$ and 200 sccm $N_2$ was discharged into the reaction chamber through a second multiple hole injector having similar design. After the $TiCl_4$ pulse a purge of 1 slm $N_2$ was applied to the $TiCl_4$ injector for 30 seconds, leaving the $NH_3$ and $N_2$ flows through the $NH_3$ injector unchanged. Then, in an $NH_3$ flush step, the $NH_3$ flow was increased to 1 slm for 2 minutes. After the $NH_3$ flush step the $NH_3$ flow was reduced to 187 sccm again and once again the $TiCl_4$ was purged with 1 slm for 30 seconds. After this the cycle starts again with a $TiCl_4$ pulse. During all steps, a purge flow of 100 sccm $N_2$ was discharged through the purge gas injector opening proximate a top end of the reaction chamber. The pressure inside the reaction chamber during the $TiCl_4$ pulses was about 500 mTorr and the reaction chamber temperature was about 500° C. Through 16 cycles, a film having a thickness of 21 nm and a resistivity of 185 $\mu\Omega\cdot cm$ was deposited.

It will be appreciated that the hardware set-up of FIGS. 1, 2, 7 and 8, although described here in the context of pulsed CVD and ALD, is equally suitable for use in the context of low pressure chemical vapor deposition (LPCVD). Further, such a hardware set-up can also be utilized for other deposition chemistries such as $Al_2O_3$ deposition using trimethyl aluminum (TMA) and $H_2O$ as precursors and the deposition of hafnium oxide ($HfO_2$) using hafnium chloride and water as precursors.

In addition, while the illustrated reactors are shown holding substrates in a vertically-separated manner, the methods described herein can be applied to any batch reactor including, e.g., reactors which hold substrates in a horizontally separated manner.

Where both reactants are pulsed, it will be appreciated that pulse times for both reactants can be the same or each can have a different pulse duration. Moreover, whether one or both reactants are pulsed, the duration of the pulses can remain the same throughout a deposition, or can vary over the course of the deposition.

Accordingly, it will be appreciated by those skilled in the art that various other omissions, additions and modifications may be made to the methods and structures described above without departing from the scope of the invention. All such modifications and changes are intended to fall within the scope of the invention, as defined by the appended claims.

We claim:

1. A method of forming a titanium nitride film by chemical vapor deposition, comprising:

providing a vertical furnace having a reaction chamber, the reaction chamber configured to accommodate 25 or more substrates;

providing a plurality of substrates in the reaction, chamber;

chemical vapor depositing the titanium nitride film on the plurality of substrates by performing a plurality of chemical vapor deposition cycles, each cycle performed at a deposition temperature of less than about 500° C. and each cycle comprising:

exposing the plurality of substrates to a titanium precursor by flowing the titanium precursor into the reaction chamber;

simultaneously flowing a nitrogen precursor into the reaction chamber while exposing the plurality of substrates to the titanium precursor;

stopping the flow of the titanium precursor; and subsequently exposing the plurality of substrates to the nitrogen precursor by flowing the nitrogen precursor into the reaction chamber at an elevated flow rate, wherein the elevated flow rate is higher than a flow rate of the nitrogen precursor during the exposing of the plurality of substrates to the titanium precursor, wherein the titanium nitride film formed by performing the plurality of chemical vapor deposition cycles has a resistivity that varies by less than about 5 μOhm-cm from substrate to substrate within the plurality of substrates.

2. The method of claim 1, wherein the substrates are 200 mm wafers.

3. The method of claim 1, wherein the substrates are 300 mm wafers.

4. The method of claim 1, wherein flowing the titanium precursor comprises depositing more than one monolayer of titanium nitride over each of the substrates during each of the plurality of chemical vapor deposition cycles.

5. The method of claim 4, wherein flowing the nitrogen precursor comprises continuously flowing the nitrogen precursor into the reaction chamber between and during each of the plurality of chemical vapor deposition cycles.

6. The method of claim 1, wherein flowing the nitrogen precursor comprises introducing the nitrogen precursor from a plurality of vertically distributed points distributed substantially along a vertical axis of the reaction chamber.

7. The method of claim 6, wherein the plurality of vertically distributed points are holes of a gas injector.

8. The method of claim 6, wherein flowing the titanium precursor comprises introducing the titanium precursor proximate to only one end of the reaction chamber and flowing the titanium precursor toward an other end of the reaction chamber.

9. The method of claim 1, wherein the titanium precursor and the nitrogen precursor are non-radical species.

10. The method of claim 1, wherein the titanium precursor is titanium tetrachloride.

11. The method of claim 10, wherein flowing the titanium precursor comprises flowing an inert gas through a bubbler comprising the titanium tetrachloride.

12. The method of claim 10, wherein flowing the titanium precursor comprises vaporizing the titanium tetrachloride in a liquid vaporizer.

13. The method of claim 10, wherein the nitrogen precursor is ammonia.

14. The method of claim 1, wherein flowing the titanium precursor and flowing the nitrogen precursor comprise introducing the titanium precursor and the nitrogen precursor through an inlet proximate one vertical end of the reaction chamber and exhausting the titanium precursor and the nitrogen out of an opposing vertical end of the reaction chamber.

15. The method of claim 1, wherein the reaction chamber is configured to accommodate 50 or more substrates.

16. The method of claim 15, wherein the reaction chamber is configured to accommodate 100 or more substrates.

17. The method of claim 1, wherein each of the plurality of chemical vapor deposition cycles comprises purging the reaction chamber with an inert gas after exposing the plurality of substrates to the titanium precursor.

18. The method of claim 17, wherein purging the reaction chamber with inert gas comprises flowing the nitrogen precursor into the reaction chamber with the inert gas.

19. The method of claim 1, wherein, in each chemical vapor deposition cycle, exposing the plurality of substrates to the titanium precursor occurs for about 30 seconds or less.

20. The method of claim 1, wherein chemical vapor depositing the titanium nitride film forms the titanium nitride film having a resistivity of about 220 μOhm·cm or less.

* * * * *

UNITED STATES PATENT AND TRADEMARK OFFICE
CERTIFICATE OF CORRECTION

PATENT NO. : 7,732,350 B2  Page 1 of 1
APPLICATION NO. : 11/634043
DATED : June 8, 2010
INVENTOR(S) : Hasper et al.

It is certified that error appears in the above-identified patent and that said Letters Patent is hereby corrected as shown below:

In Column 7, lines 29-30, please change "100a, 100b" to --110a, 110b--.

In Column 9, line 4, please change "reaction," to --reaction--.

Signed and Sealed this

Twenty-third Day of November, 2010

David J. Kappos
*Director of the United States Patent and Trademark Office*